(12) United States Patent
Zhang et al.

(10) Patent No.: US 11,348,952 B2
(45) Date of Patent: May 31, 2022

(54) CONNECTION STRUCTURE AND FABRICATION METHOD THEREOF, ARRAY SUBSTRATE AND FABRICATION METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Zhen Zhang, Beijing (CN); Pengyu Liao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 16/638,196

(22) PCT Filed: May 29, 2019

(86) PCT No.: PCT/CN2019/089096
§ 371 (c)(1),
(2) Date: Feb. 11, 2020

(87) PCT Pub. No.: WO2019/228421
PCT Pub. Date: Dec. 5, 2019

(65) Prior Publication Data
US 2020/0365627 A1  Nov. 19, 2020

(30) Foreign Application Priority Data
May 31, 2018 (CN) .......................... 201810554032.4

(51) Int. Cl.
*H01L 27/12* (2006.01)
*H01L 21/31* (2006.01)
(Continued)

(52) U.S. Cl.
CPC ...... *H01L 27/1288* (2013.01); *H01L 27/1244* (2013.01); *H01L 27/1248* (2013.01);
(Continued)

(58) Field of Classification Search
CPC ... H01L 21/31; H01L 21/31144; H01L 27/12; H01L 27/121; H01L 27/124;
(Continued)

(56) References Cited

U.S. PATENT DOCUMENTS 6,204,168 B1  3/2001  Naik et al.
6,294,315 B2  9/2001  Shin et al.
(Continued)

FOREIGN PATENT DOCUMENTS

| CN | 106449695 A | 2/2017 |
| CN | 107919377 A | 4/2018 |
| CN | 108493155 A | 9/2018 |

*Primary Examiner* — Fazli Erdem
(74) *Attorney, Agent, or Firm* — Dilworth & Barrese, LLP.; Michael J. Musella, Esq.

(57) ABSTRACT

Embodiments of the present provide a connection structure and a manufacturing thereof, an array substrate and a manufacturing method thereof, the manufacturing method of the connection structure includes: forming a first insulating layer on a base substrate forming a mask layer having a first opening on a side of the first insulating layer away from the base substrate; forming a second insulating layer op a side of the mask layer away-from the first insulating layer; forming a second opening exposing the first opening in the second insulating layer by one patterning process, and forming a third opening in the first insulating layer.

18 Claims, 7 Drawing Sheets

(51) Int. Cl.
  *G06F 1/16* (2006.01)
  *H01L 27/32* (2006.01)
  *H01L 21/311* (2006.01)
  *H01L 51/00* (2006.01)

(52) U.S. Cl.
  CPC ...... *H01L 27/3258* (2013.01); *H01L 27/3276* (2013.01); *H01L 21/31144* (2013.01); *H01L 51/0097* (2013.01)

(58) Field of Classification Search
  CPC .............. H01L 27/128; H01L 27/1218; H01L 27/1244; H01L 27/1248; H01L 27/128832; H01L 27/325; H01L 27/2257; H01L 27/327; H01L 27/3276; H01L 51/0097; G06F 1/162; G06F 1/165; G06F 1/1656; G06F 1/1658; G06F 1/1626
  USPC ........................................................ 257/773
  See application file for complete search history.

(56) References Cited

U.S. PATENT DOCUMENTS

| | | | |
|---|---|---|---|
| 2003/0062627 A1* | 4/2003 | Naik | ................ H01L 21/76811 257/774 |
| 2014/0113438 A1 | 4/2014 | Usami | |
| 2019/0341436 A1 | 11/2019 | Cho et al. | |

* cited by examiner

CONNECTION STRUCTURE AND FABRICATION METHOD THEREOF, ARRAY SUBSTRATE AND FABRICATION METHOD THEREOF

This application claims priority of the Chinese Patent Application No. 201810554032.4, filed on May 31, 2018, the disclosure of which is incorporated herein by reference in its entirety as part of the present application.

TECHNICAL FIELD

Embodiments of the present disclosure relate to a connection structure and a manufacturing method thereof, an array substrate and a manufacturing method thereof.

BACKGROUND

For portable electronic products, it is often necessary to bend the circuit. For example, in the display technical field, in order to realize narrow frame or even no frame display, the bonding pad region of the display device needs to be bent. Or in order to realize flexible display, it is also necessary to make a bending-resistant connection structure. The manufacturing process of the bending-resistant connection structure is a topic of concern in this field.

SUMMARY

At least one embodiment of the present disclosure provides a manufacturing method of a connection structure, including: forming a first insulating layer on a base substrate; forming a mask layer having a first opening on a side of the first insulating layer away from the base substrate; forming a second insulating layer on a side of the mask layer away from the first insulating layer; and forming a second opening exposing the first opening in the second insulating layer by one patterning process, and forming a third opening in the first insulating layer.

For example, forming the second opening and the third opening by one patterning process includes forming the second opening and the third opening by a same patterning mask.

For example, forming the second opening includes: etching the second insulating layer by using an etching mask formed on the second insulating layer as a mask; forming the third opening includes: etching the first insulating layer by using the etching mask and a portion of the mask layer exposed by the second opening as masks. The etching mask is the same patterning mask.

For example, in a direction parallel to the base substrate, a size of the second opening is larger than a size of the first opening, and the second opening completely exposes the first opening.

For example, a material of the mask layer includes a semiconductor material, materials of the first insulating layer and the second insulating layer both include an inorganic insulating material, and an etching rate of the material of the mask layer is smaller than an etching rate of the materials of the first insulating layer and the second insulating layer in a same dry etching process. A step of forming the second opening and the third opening includes: sequentially forming the second opening and the third opening in the same dry etching process.

For example, the material of the mask layer includes polysilicon, the materials of the first insulating layer and the second insulating layer include silicon element, and a concentration of fluorine element in a gas atmosphere upon the third opening being formed is lower than a concentration of fluorine element in a gas atmosphere upon the second opening being formed.

For example, the base substrate is a flexible substrate.

For example, the manufacturing method further includes: forming a conductive layer in the first opening, the second opening, and the third opening, and on a side of the second insulating layer away from the first insulating layer.

At least one embodiment of the present disclosure provides a manufacturing method of an array substrate, the array substrate includes a display area, a bonding pad region and a bendable region between the display area and the bonding pad region, the bendable region has a connection structure, the manufacturing method includes: forming the connection structure by the manufacturing method as mentioned above, and the first opening, the second opening and the third opening are in the bendable region.

For example, the manufacturing method includes: forming a conductive layer in the first opening, the second opening, and the third opening, and on a side of the second insulating layer away from the first insulating layer. The conductive layer further includes a lead connecting the display area and the bonding pad region.

For example, the manufacturing method further includes: forming an active layer, a source and drain electrode layer and a gate electrode of a thin film transistor in the display area. The mask layer and the active layer are formed by patterning a same semiconductor material layer, and the conductive layer and one of the source and drain electrode layer and the gate electrode are formed by patterning a same conductive material layer.

For example, before forming the conductive layer, the manufacturing method further includes: forming a stress buffer layer in the first opening, the second opening, and the third opening; forming the conductive layer includes forming the conductive layer on a side of the stress buffer layer away from the base substrate; after forming the conductive layer, the manufacturing method further includes: forming a protective layer on a side of the conductive layer away from the stress buffer layer, a material of the protective layer includes an organic insulating material.

At least one embodiment of the present disclosure provides a connection structure, including: a base substrate; and a first insulating layer, a mask layer and a second insulating layer. The first insulating layer, the mask layer and the second insulating layer are sequentially laminated on the base substrate, the mask layer includes a first opening and a first portion not covered by the second insulating layer and surrounding the first opening, the second insulating layer includes a second opening, the first insulating layer includes a third opening, the second opening exposes the first opening and the first opening exposes the third opening.

For example, the mask layer further includes a second portion covered by the second insulating layer and surrounding the first opening, and an orthographic projection of the first opening on the base substrate and an orthographic projection of the third opening on the base substrate are approximately coincident.

For example, a thickness of the first portion of the mask layer is smaller than a thickness of the second portion of the mask layer.

For example, a material of the mask layer includes polysilicon, and materials of the first insulating layer and the second insulating layer include silicon element.

For example, the connection structure further includes a stress buffer layer, the stress buffer layer is in the first opening, the second opening, and the third opening and in contact with exposed surfaces of the first opening, the second opening, and the third opening.

For example, the connection structure further includes a conductive layer on a side of the stress buffer layer away from the base substrate.

For example, a protective layer is on a side of the conductive layer away from the stress buffer layer, and the protective layer includes an organic insulating material.

At least one embodiment of the present disclosure provides an array substrate, including a display area, a bonding pad region, a bendable region between the display area and the bonding pad region, and the connection structure as mentioned above. The connection structure is in the bendable region.

For example, the array substrate further includes: a conductive layer. The conductive layer is in the first opening, the second opening, and the third opening, and on a side of the second insulating layer away from the base substrate, and the conductive layer further includes a lead connecting the display area and the bonding pad region.

For example, the array substrate further includes: a thin film transistor in the display area. An active layer of the thin film transistor is on a same layer as the mask layer.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
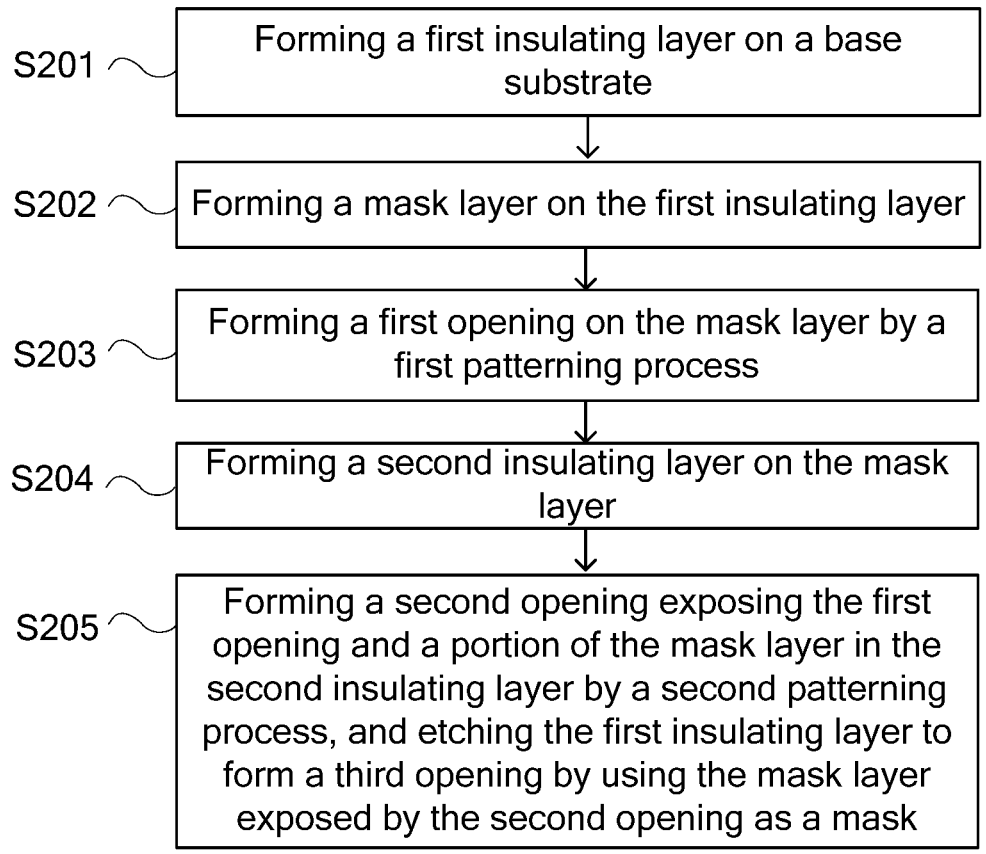
FIG. 1 is a flow chat of a manufacturing method of a connection structure according to an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "Upper", "lower", "left", "right", etc. are only used to indicate the relative positional relationship, and when the absolute position of the object to be described is changed, the relative positional relationship may also change accordingly.

In the research, the inventor of this application found that inorganic insulating materials are usually poor in flexibility and easy to break under the action of external force, thus affecting the conductive characteristics of conductive materials attached to the inorganic insulating materials. In order to manufacture a bending-resistant connection structure, inorganic insulating material of the connection structure in the bendable region can be removed to form an opening, and a step structure is formed at the opening, thereby preventing the later formed conductive material from being broken due to excessive segment difference.

At least one embodiment of the present disclosure provides a connection structure and a manufacturing method thereof, and an array substrate and a manufacturing method thereof. The manufacturing method of the connection structure includes: forming a first insulating layer on a base substrate; forming a mask layer having a first opening on a side of the first insulating layer away from the base substrate; forming a second insulating layer on a side of the mask layer away from the first insulating layer; forming a second opening exposing the first opening in the second insulating layer by one patterning process, and forming a third opening in the first insulating layer. The mask layer formed in advance is used to form an upper opening and a lower opening through one patterning process so as to form a step structure, thereby simplifying the manufacturing process and reducing the manufacturing cost.

FIG. 1 is a flow chat of a manufacturing method of a connection structure according to an embodiment of the present disclosure, and FIGS. 2A-2J are schematic diagrams showing steps of the manufacturing method of the connection structure. As illustrated in the figures, the manufacturing method of the connection structure includes the following steps of S201 to S205.

S201: forming a first insulating layer 101 on a base substrate 110.

Figure 2A:
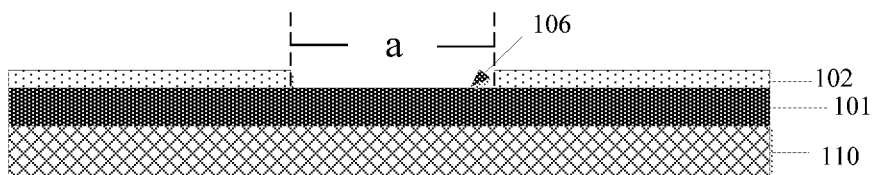
FIGS. 2A-2J are schematic diagrams showing steps of the manufacturing method of the connection structure according to an embodiment of the present disclosure.

For example, as illustrated in FIG. 2A, the base substrate 110 can be an inorganic substrate (e.g., glass, quartz, sapphire, silicon wafer, etc.) or an organic flexible substrate (e.g., polyimide (PI), polyethylene terephthalate (PET), polycarbonate, polyethylene, polyacrylate, polyetherimide, polyethersulfone, etc.), and the embodiment includes but is not limited to thereto.

For example, the first insulating layer 101 can include an inorganic insulating material, such as an oxide of silicon, a nitride of silicon or a nitrogen oxide of silicon, such as silicon oxide, silicon nitride, silicon oxynitride, etc. or an insulating material including a metal element such as aluminum oxide, titanium nitride, etc. For example, the first insulating layer 101 can further include an organic insulating material such as acrylic acid, polymethyl methacrylate (PMMA), and the like.

For example, the first insulating layer 101 can be a single-layer structure or a multi-layer structure including a plurality of insulating material layers. The present disclosure is not limited thereto.

For example, a step of forming the first insulating layer can adopt a chemical vapor deposition process (e.g., forming an inorganic insulating material) or spin coating, printing (e.g., forming an organic insulating material), etc.

For example, the first insulating layer can include a buffer layer so that the base substrate has a flatter surface. For example, the first insulating layer can further include a barrier layer to isolate moisture or air, thereby protecting the structure formed on the first insulating layer.

S202: forming a mask layer on the first insulating layer 101.

For example, as illustrated in FIG. 2A, the mask layer 102 can have a material different from that of the first insulating layer 101, for example, the mask layer can be a conductive layer or a semiconductor layer. For example, the material of the mask layer 102 is a semiconductor material including silicon, such as a polysilicon material.

S203: forming a first opening 106 in the mask layer 102 by a first patterning process.

For example, as illustrated in FIG. 2A, a cross-sectional size of the first opening 106 is a. For example, a can be 1800 microns.

For example, the first patterning process can be a conventional photolithography process, including steps such as photoresist coating, exposure, development, etching, photoresist stripping, and the like.

S204: forming a second insulating layer 103 on the mask layer 102.

Figure 2B:
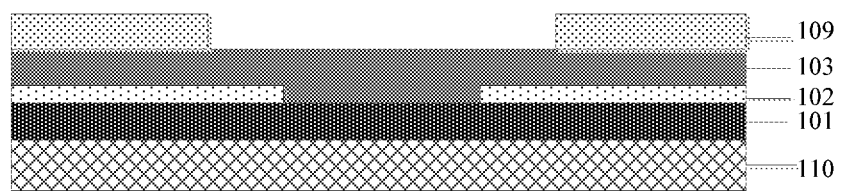
Figure 2C:
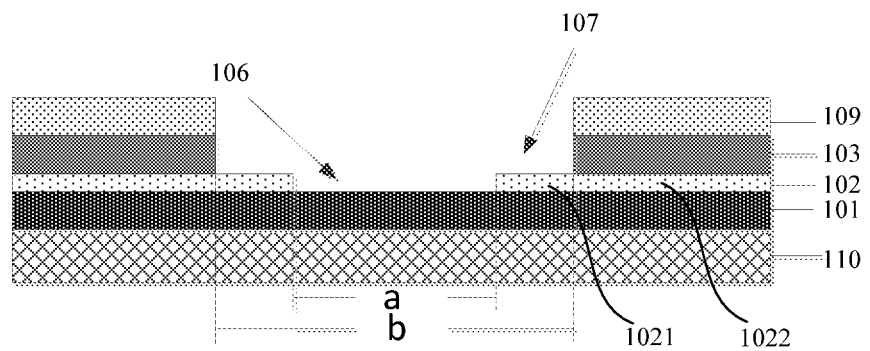

For example, as illustrated in FIG. 2B, the second insulating layer 103 can include an inorganic insulating material, such as an oxide of silicon, a nitride of silicon or a nitrogen oxide of silicon, such as silicon oxide, silicon nitride, silicon oxynitride, etc. or an insulating material including a metal element such as aluminum oxide, titanium nitride, etc. For example, the second insulating layer 103 can further include an organic insulating material such as acrylic acid, polymethyl methacrylate (PMMA), and the like.

For example, the second insulating layer 103 can be a single-layer structure or a multi-layer structure including a plurality of insulating material layers. The present disclosure is not limited thereto.

For example, a step of forming the second insulating layer can adopt a chemical vapor deposition process (e.g., forming an inorganic insulating material) or spin coating, printing (e.g., forming an organic insulating material), etc.

S205: forming a second opening exposing the first opening and a portion of the mask layer in the second insulating layer by a second patterning process, and etching the first insulating layer to form a third opening by using the mask layer exposed by the second opening as a mask.

For example, steps of forming the second opening exposing the first opening in the second insulating layer by one patterning process and forming the third opening in the first insulating layer includes: forming the second opening and the third opening by the same patterning mask. A step of forming the second opening includes: etching the second insulating layer by using an etching mask formed on the second insulating layer as a mask. A step of forming the third opening includes: etching the first insulating layer by using the etching mask and a portion of the mask layer exposed by the second opening as masks. The etching mask here is the same patterning mask mentioned above. For example, in order to prevent the mask layer from being completely etched before etching the first insulating layer, an etching rate of the second insulating layer by the gas selected to etch the second insulating layer is higher than that of the mask layer.

For example, the second patterning process can include sequentially forming a second opening 107 and a third opening 108. As illustrated in FIG. 2B, the second patterning process includes, for example, a conventional photolithography process: first, forming a photoresist layer on the second insulating layer 103, and exposing and developing the photoresist layer by a mask plate to form an etching mask 109, and then, etching the second insulating layer 103 by the etching mask 109 to form the second opening 107 at a position corresponding to the first opening 106. The etching mask 109 is designed to make the size of the second opening 107 larger than that of the first opening 106, for example, the cross-sectional size b of the second opening 107 is larger than the cross-sectional size a of the first opening 106. Thus, the second opening 107 completely exposes the first opening 106 and a portion of the mask layer 102. The mask layer 102 includes a first portion 1021 not covered by the second insulating layer 103 and surrounding the first opening 106 and a second portion 1022 covered by the second insulating layer 103, and the second opening 107 exposes the first opening 106 and the first portion 1021 of the mask layer 102.

Figure 2D:
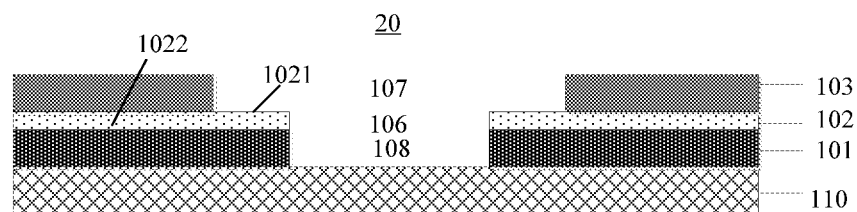

For example, as illustrated in FIG. 2D, the first insulating layer 101 is etched by using the etching mask 109 and the first portion 1021 of the mask layer 102 as masks together to form the third opening 108, thereby forming the connection structure 20 having a step structure which includes the second opening 107 and the third opening 108 in one-step patterning process (using one mask plate). Thus, the first opening 106 exposes the third opening 108, and the first opening 106 and the third opening 108 have the same contour. In an ideal etching process, as illustrated in FIG. 2D, the contours of the first opening 106 and the third opening 108 are exactly the same. However, due to process deviation, the first opening 106 and the third opening 108 may do not have exactly the same contour, but have substantially the same contour, which is also included in the protection scope of the present disclosure. In the following, the "same contour" in the present disclosure will be exemplarily explained to facilitate being better understood by those skilled in the art.

Figure 2E:
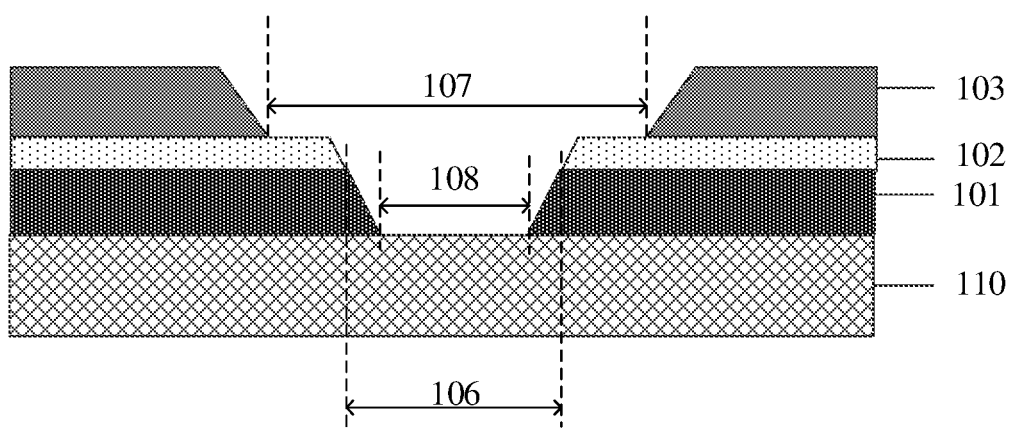

In one example, as illustrated in FIG. 2E, each opening is easy to form a structure having trapezoidal section as illustrated in FIG. 2E in actual process, and the contour of the first opening 106 is slightly larger than that of the third opening 108.

Figure 2F:
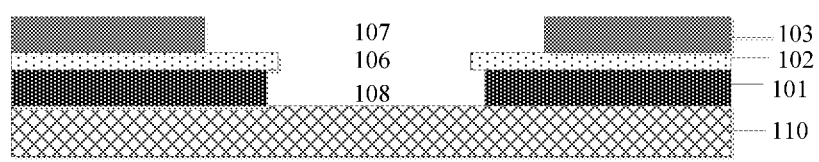

In another example, as illustrated in FIG. 2F, assuming that the anisotropy of the etching process is not ideal, the third opening 108 is easy to form an "undercut" structure as illustrated, and the contour of the first opening 106 is slightly smaller than that of the third opening 108.

For example, in a case that the connection structure is in a bending state, the contours of the first opening 106 and the third opening 108 can change due to stress. Those skilled in the art should understand that as long as the connection structure having the third opening is formed by using the mask layer with the first opening as a mask, which falls within the protection scope of the present disclosure.

Figure 2G:
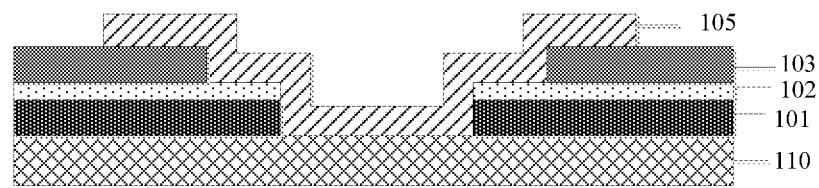

For example, as illustrated in FIG. 2G, the manufacturing method can further include forming a conductive layer 105 to fill the first opening 106, the second opening 107, and the third opening 108. The conductive layer 105 extends through the second opening 107, passes over the second opening 107 from left to right as illustrated in the figure, and its contour changes with the contour of a stress buffer layer, thus the connection structure having an electrical connection function and an anti-stretching function during bending is formed.

For example, the material of the conductive layer 105 includes gold (Au), silver (Ag), copper (Cu), aluminum (Al), molybdenum (Mo), magnesium (Mg), tungsten (W), and an alloy material formed by combining any of the above metal materials; or conductive metal oxide materials such as indium tin oxide (ITO), indium zinc oxide (IZO), zinc oxide (ZnO), aluminum zinc oxide (AZO), etc.

Figure 2H:
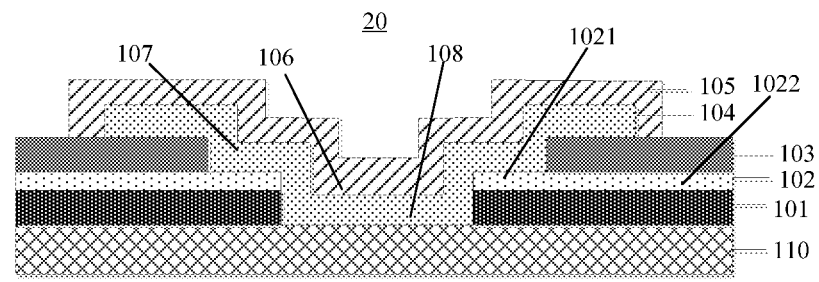

For example, as illustrated in FIG. 2H, the manufacturing method can further include: forming a stress buffer layer 104 in the first opening 106, the second opening 107, and the third opening 108 before forming the conductive layer 105, and the conductive layer 105 is formed on the stress buffer layer 104. The stress buffer layer can reduce (or prevent) the probability of fracture of conductive materials formed thereon due to bending stress. In addition, the stress buffer layer can isolate contamination from the base substrate. The stress buffer layer can include an organic insulating material, for example, the stress buffer layer includes polyimide, acrylate, epoxy resin, etc.

Figure 2I:
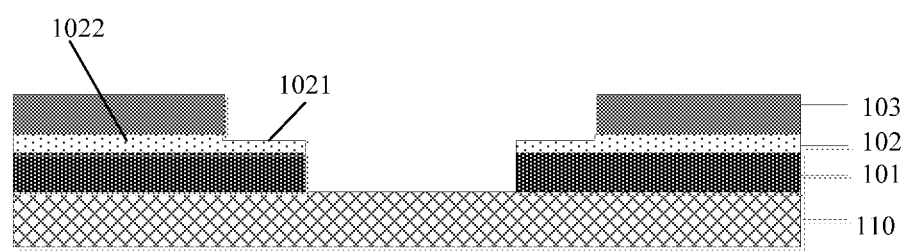
Figure 2J:
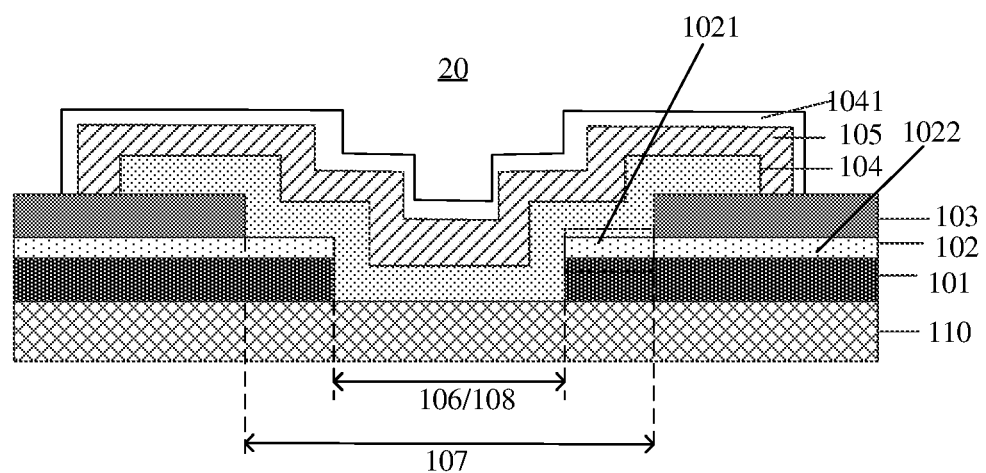

For example, as illustrated in FIG. 2J, the manufacturing method can further include forming a protective layer 1041 on the side of the conductive layer 105 away from the stress buffer layer 104 after forming the conductive layer 105. The material of the protective layer 1041 includes an organic insulating material for protecting the conductive layer 105.

For example, in one example of the embodiments of the present disclosure, the stress buffer layer and the protective layer both can be provided, and in another example of the embodiments of the present disclosure, only one of the stress buffer layer and the protective layer can be provided.

In a case where the material of the mask layer 102 is polysilicon and the first insulating layer 101 and the second insulating layer 103 both have insulating materials containing silicon, how to form the second opening 107 and the third opening 108 through the second patterning process in the above-mentioned step 205 will be exemplarily described.

For example, the second opening and the third opening are formed by a dry etching process. Firstly, carbon tetrafluoride gas is introduced into the etching equipment, and the carbon tetrafluoride gas is ionized in the etching equipment to form plasma including fluorine ions and carbon trifluoride ions. The carbon trifluoride ions have corrosive effects on insulating materials, and the fluorine ions have corrosive effects on polysilicon materials. Under the mask of the etching mask 109, the second insulating layer 103 is etched by carbon trifluoride ions to form the second opening 107 and expose the first portion 1021 of the mask layer 102. In this case, the etching equipment issues an instruction under which hydrogen gas is introduced into the etching equipment, and the hydrogen gas is ionized to form hydrogen ions and reacts with fluorine ions to generate hydrogen fluoride gas, and the hydrogen fluoride gas is extracted, so that the first portion 1021 of the mask layer 102 is retained, and under the common mask of the first portion 1021 of the mask layer 102 and the etching mask 109, the carbon trifluoride ions then etch the first insulating layer 101 to form the third opening 108.

In one example, the time required to etch the second insulating layer 103 can be calculated by the thickness of the second insulating layer 103 and its etching rate, thereby causing the etching equipment to issue the instruction in a case that the etching of the second insulating layer 103 is finished. In another example, when the etching of the second insulating layer is finished and polysilicon of the first portion is exposed, fluorine ions are consumed by starting to etch polysilicon of the first portion, and the etching equipment detects that the concentration of fluorine elements starts to decrease and issues the instruction. That is, the second opening and the third opening are sequentially formed in the same dry etching process, and the concentration of fluorine element in the gas atmosphere upon the third opening being formed is lower than the concentration of fluorine element in the gas atmosphere upon the second opening being formed. However, in actual situations, because the sensitivity of the etching equipment is not ideal, or fluorine ions in the etching equipment are not completely extracted and fluorine ion corrosion still exists, the thickness of the second portion 1022 of the mask layer is larger than that of the first portion 1021 not covered by the second insulating layer 103, as illustrated in FIG. 2I.

At least one embodiment of the present disclosure further provides a connection structure 20 formed by the manufacturing method mentioned above. As illustrated in FIG. 2H, the connection structure 20 includes a base substrate 110, a first insulating layer 101, a mask layer 102, and a second insulating layer 103, the first insulating layer 101, the mask layer 102, and the second insulating layer 103 are sequentially laminated on the base substrate 110, and the first insulating layer 101 is located on a side of the mask layer 102 facing the base substrate 110. The mask layer 102 includes a first opening 106, the second insulating layer 103 includes a second opening 107, and the first insulating layer 101 includes a third opening 108. The mask layer 102 further includes a first portion 1021 not covered by the second insulating layer 103 and surrounding the first opening 106, the second opening 107 exposes the first opening 106 and the first portion 1021 of the mask layer 102, the first opening 106 exposes the third opening 108, and an orthographic projection of the first opening 106 on the base substrate 110 and an orthographic projection of the third opening 108 on the base substrate 110 are approximately coincident. For example, in a case that the connection structure 20 is in a plane state without bending, the orthographic projection of the first opening 106 on the base substrate 110 covers the orthographic projection of the third opening 108 on the base substrate 110, and an orthographic projection of the second opening 107 on the base substrate 110 covers and exceeds the orthographic projection of the first opening 106 on the base substrate 110. In this case, the second opening 107 and the third opening 108 form a step structure as illustrated in FIG. 2D, which can prevent the conductive material formed thereon from being broken due to excessive segment difference.

For example, as illustrated in FIG. 2G, the connection structure further includes a conductive layer 105 that fills the first opening 106, the second opening 107, and the third opening 108, i.e., the conductive layer 105 is conformally formed in the first opening 106, the second opening 107, and the third opening 108. The conductive layer 105 is conformally formed on the base substrate 110, the mask layer 102, and the second insulating layer 103 to form the step structure. And a contour of the conductive layer 105 changes with the contour of the stress buffer layer, thus the connection structure having an electrical connection function and an anti-stretching function during bending is formed.

For example, the material of the conductive layer includes gold (Au), silver (Ag), copper (Cu), aluminum (Al), molybdenum (Mo), magnesium (Mg), tungsten (W), and alloy materials formed by combining any of the above metal materials; or conductive metal oxide materials such as indium tin oxide (ITO), indium zinc oxide (IZO), zinc oxide (ZnO), aluminum zinc oxide (AZO), etc.

For example, as illustrated in FIG. 2H, the connection structure further includes a stress buffer layer 104 between the conductive layer 105 and the second insulating layer 103, the stress buffer layer 104 fills the first opening 106, the second opening 107, and the third opening 108. That is, the stress buffer layer 104 is conformally formed in the first opening 106, the second opening 107, and the third opening 108 to form a step structure. The stress buffer layer 104 is in contact with exposed surfaces of the first opening 106, the second opening 107, and the third opening 108. The stress buffer layer can reduce or prevent the conductive material formed thereon from being broken due to bending stress. The stress buffer layer can include an organic insulating material, for example, the stress buffer layer includes polyimide, acrylate, epoxy resin, etc.

For example, as illustrated in FIG. 2J, the connection structure can further include a protective layer 1041 located on the side of the conductive layer 105 away from the stress buffer layer 104, and the material of the protective layer 1041 includes an organic insulating material for protecting the conductive layer 105.

For example, as illustrated in FIG. 2I, the mask layer 102 includes a first portion 1021 not covered by the second insulating layer 103 and surrounding the first opening 106, and a second portion 1022 covered by the second insulating layer 103. The thickness of the first portion 1021 is smaller than that of the second portion 1022.

Other features of the connection structure refer to the previous description and will not be described herein.

Embodiments of the present disclosure also provide an array substrate and a manufacturing method thereof. The array substrate includes the connection structure mentioned above, and the manufacturing method of the array substrate includes forming the connection structure by the manufacturing method mentioned above.

For example, the array substrate can be an array substrate used for a liquid crystal display device, or an array substrate used for an organic light emitting diode (OLED) display device. The array substrate can be an array substrate having a plane shape, a flexible array substrate or a curved array substrate. The connection structure can be located in the display area of the array substrate, can be located in the non-display area of the array substrate, can also be located partially in the display area and partially in the non-display area; the connection structure can be in a plane state or in a bending state. Those skilled in the art should understand that as long as the array substrate includes the connection structure formed by the manufacturing method mentioned above, the array substrate and the manufacturing method thereof fall within the protection scope of the present disclosure.

Figure 3:
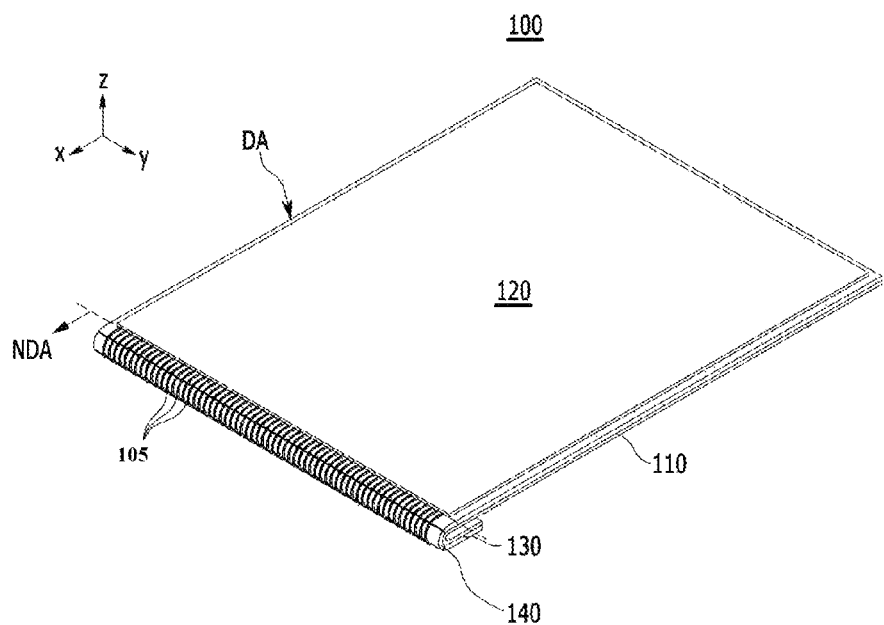
FIG. 3 is a schematic diagram of an array substrate according to an embodiment of the present disclosure.
Figure 4:
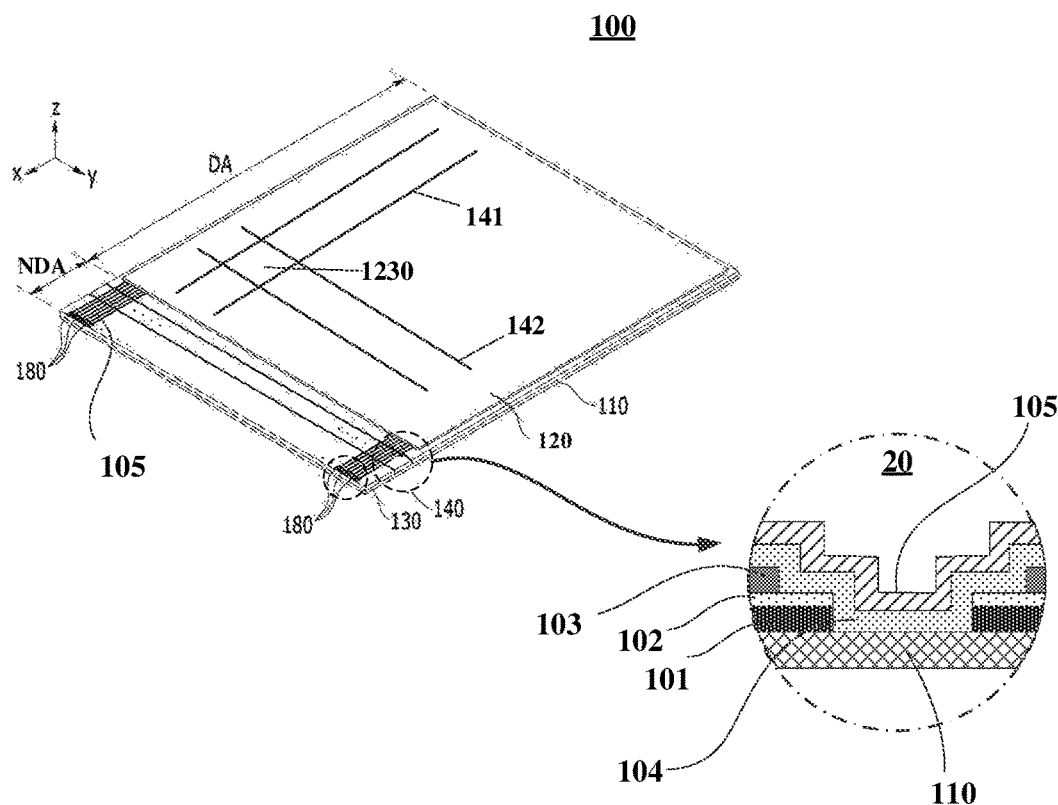
FIG. 4 is a schematic diagram of the array substrate in an unfolded state according to an embodiment of the present disclosure.
Figure 5:
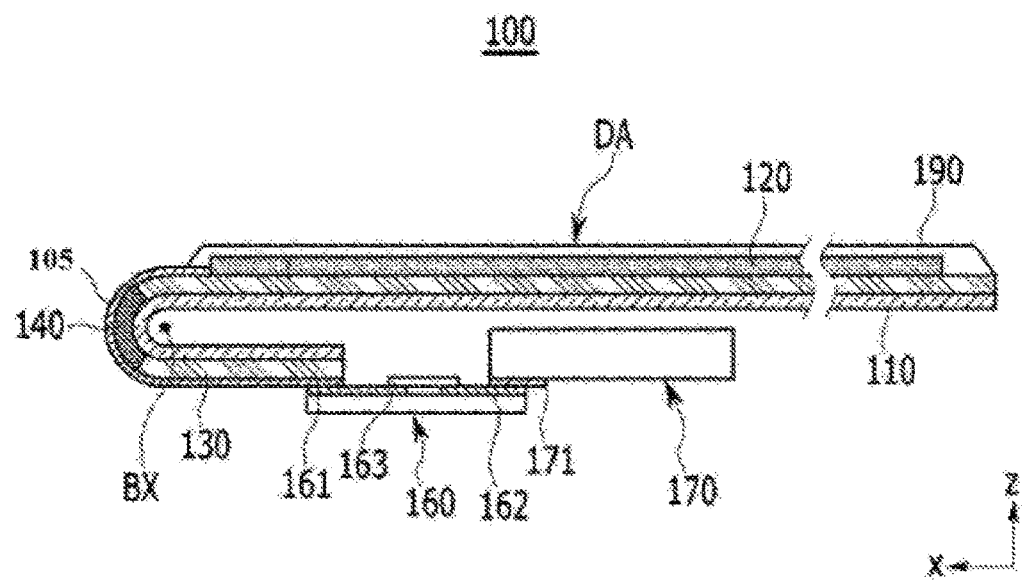
FIG. 5 is a section view of the array substrate in an X direction according to an embodiment of the present disclosure.

FIG. 3 is a schematic diagram of an array substrate according to an embodiment of the present disclosure, FIG. 4 is a schematic diagram of the array substrate in an unfolded state, and FIG. 5 illustrates a section view of the array substrate taken by an XZ plane. As illustrated in FIGS. 3, 4 and 5, the array substrate 100 includes a display area (DA), a bonding pad region 130, and a bendable region 140 located between the display area and the bonding pad region 130. The bonding pad region 130 and the bendable region 140 are both located in a non-display area (NDA) other than the display area. The array substrate 100 includes a base substrate 110, and a display unit 120 and bonding pad electrodes 180 located on the base substrate.

The base substrate is a flexible substrate, for example, an organic flexible substrate (such as polyimide (PI), polyethylene terephthalate (PET), polycarbonate, polyethylene, polyacrylate, polyetherimide, polyethersulfone, etc.).

The display unit 120 is located in the display area and includes a plurality of data lines 141 extending in the X direction and a plurality of gate lines 142 extending in the Y direction. The plurality of gate lines and the plurality of data lines cross each other to define a plurality of pixel regions, and each of the plurality of pixel regions is provided with a pixel unit 1230. For the sake of clarity, only a few gate lines and a few data lines are schematically illustrated in FIG. 4. The present disclosure will describe the specific structure of the pixel unit 1230 in detail below.

As illustrated in FIG. 5, the bendable region 140 is bent relative to the bending axis (BX). For example, in order to facilitate wiring, the bendable region 140 is located in the non-display area on one side of the array substrate in the X direction, that is, on one side of the extending direction of the data line 141, and the bending axis is parallel to the Y direction. In this way, a gate drive circuit can be bonded to the non-display area side of the array substrate in the Y direction, or a gate driver on array (GOA) circuit can be directly formed on the base substrate.

The connection structure 20 as mentioned above is located in the bending region, and the first opening 106, the second opening 107, and the third opening 108 correspond to the bent portion, that is, portions of the first insulating layer 101 and the second insulating layer 103 corresponding to the bending region are removed, thereby preventing the first insulating layer and the second insulating layer from being broken due to being bent. In this bending state, the first opening 106 exposes the third opening 108 and the second opening 107 exposes the first opening 106. The second opening 107 and the third opening 108 form the step structure as illustrated in the figure, which can prevent the conductive layer 105 formed thereon from being broken due to excessive segment difference. The conductive layer 105 includes, for example, leads connecting the display area and the bonding pad region 130.

The bonding pad region 130 is located on a side of the bendable region 140 away from the display area, that is, the bonding pad region is located on an edge of the array substrate in the X direction. The bonding pad electrode 180 is located in the bonding pad region 130 for bonding with an output wiring portion 161 of the chip on film (COF) 160. An input wiring portion 162 of the chip on film 160 is connected to an output wiring portion 171 of the printed circuit board (PCB) 170. The chip on film is provided with a drive chip 163. The printed circuit board 170 outputs control signals for controlling the drive chip 163 to the chip on film 160, and the chip on film 160 outputs various signals (such as display data signals, power supply voltage signals (such as VDD, VSS), etc.) to the bonding pad electrode 180, thereby transmitting to the display area through the conductive layer 105 to realize image display. For example, the bonding pad electrode 180 is connected to the data line 141 through the conductive layer 105 to provide a display data signal for the data line 141.

As illustrated in FIG. 4, by providing the bendable region with the connection structure, the bonding pad region 130 can be bent to the back of the display area to overlap with the display area, thereby reducing the external space of the display unit 120 and realizing narrow frame or even no frame display.

For example, the bendable region and the connection structure can also be located in the non-display area of the array substrate in the extending direction of the gate line 142 (i.e., Y direction), and the bending axis is parallel to the extending direction of the data line 141 (i.e., X direction). In this case, the chip on film can also be provided with a gate drive circuit. For example, bendable regions and connection structures can be arranged in non-display areas of the array substrate in both the X direction and the Y direction to realize narrow frame or even no frame display. The embodiment of the present disclosure does not limit the position of the bendable region and the connection structure.

Figure 6A:
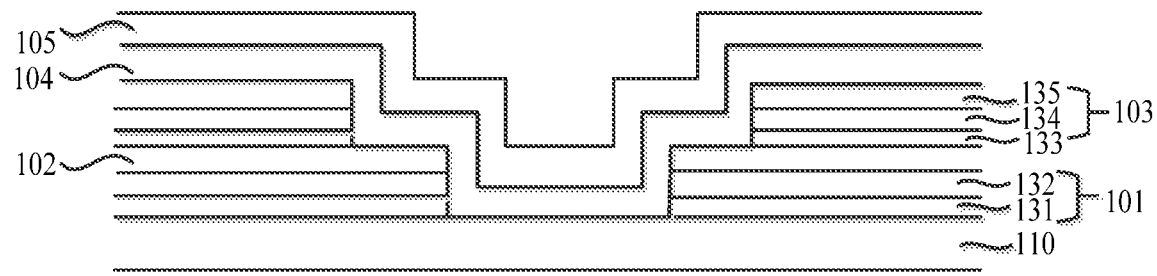
FIGS. 6A and 6B are enlarged section views of a bendable region and a display area of the array substrate according to an embodiment of the present disclosure.
Figure 6B:
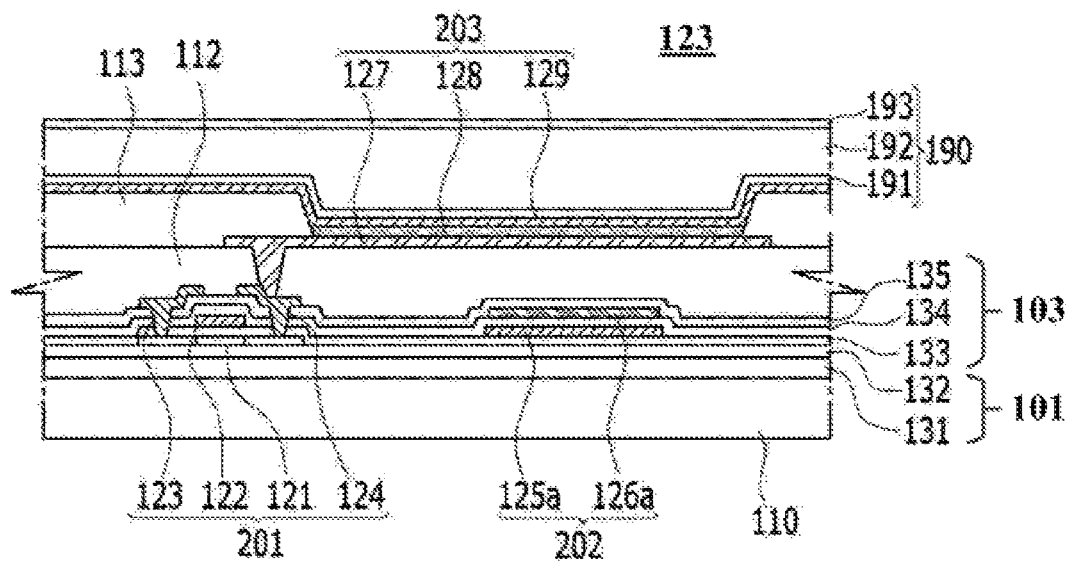

FIGS. 6A and 6B are respectively enlarged section views of the bendable region and the display area of the array substrate provided by an embodiment of the present disclosure. In the following, the array substrate is taken as an array substrate applied to an OLED display as an example, the structure of the array substrate provided by this embodiment will be exemplarily described with reference to FIGS. 6A and 6B.

As illustrated in the figure, the pixel unit 1230 of the display area includes at least one organic light emitting diode (OLED) 203 and a pixel circuit connected thereto, the organic light emitting diode emits light under the drive of the pixel circuit. For example, the pixel circuit includes a conventional OLED pixel drive circuit, for example, including a switching transistor, a thin film transistor, a storage capacitor, etc., or the pixel circuit can further include a reset transistor, a light emitting control transistor, etc. The embodiment does not limit the specific structure of the pixel circuit. For the sake of clarity, FIG. 6B illustrates only the thin film transistor 201 and the storage capacitor 202 of the pixel circuit.

For example, the array substrate further includes an encapsulation layer 190 that seals the OLED 203, so that deterioration of the OLED 203 caused by moisture and/or oxygen included in the environment can be reduced or prevented. For example, the encapsulation layer can include a first inorganic layer 191, an organic layer 192, and a second inorganic layer 193.

As illustrated in the figure, the thin film transistor 201 includes an active layer 121, a gate electrode 122, a gate insulating layer 133, and a source and drain electrode layer (including a source electrode 123 and a drain electrode 124). For example, the active layer includes a channel region and a source region and a drain region located on opposite sides of the channel region. The storage capacitor 202 includes a first capacitor electrode 125a, a first interlayer insulating layer 134, and a second capacitor electrode 126a. The organic light emitting diode 203 includes a first electrode 127, a second electrode 129, and an organic light emitting layer 128 located between the first electrode 127 and the second electrode 129. The first electrode 127 is electrically connected to the drain electrode 124 of the thin film transistor 201.

For example, the mask layer 102 is disposed on the same layer as the active layer 121 of the thin film transistor 201, and both of the mask layer and the active layer can be formed by patterning the same semiconductor material layer through the same patterning process.

For example, the conductive layer 105 and the source and drain electrode layer of the thin film transistor 201 are disposed on the same layer, and both can be formed by patterning the same conductive material layer through the same patterning process.

It should be noted that the source electrode and the drain electrode of the transistor used herein can be symmetrical in structure, so the source electrode and the drain electrode can have no distinguish in structure, and therefore the two can be interchanged according to requirement. In FIG. 6B, the thin film transistor 201 is of a top gate type, but the embodiment of the present disclosure is not limited to the specific type of the transistor. Besides the top gate type, the thin film transistor 201 can also be of a bottom gate type, a double gate type, or the like, and in a case that the transistors are of different types, the layer structures on the base substrate are correspondingly adjusted to be different from each other. For example, in one example, the conductive layer 105 is disposed on the same layer as the gate electrode 122 of the thin film transistor 201.

The first insulating layer 101 includes a barrier layer 131 and a buffer layer 132. The barrier layer is used to prevent moisture and/or oxygen from penetrating through the base substrate 110, for example, the barrier layer can be formed of a plurality of layers alternately laminated of silicon oxide and silicon nitride. The buffer layer is located on the barrier layer and is used for providing a flat surface for forming pixel units, and its material is, for example, silicon nitride, silicon oxide or silicon oxynitride. The second insulating layer 103 includes a gate insulating layer 133, a first interlayer insulating layer 134, and a second interlayer insulating layer 135, and the first interlayer insulating layer 134 serves as a dielectric layer of the storage capacitor 202.

Figure 7:
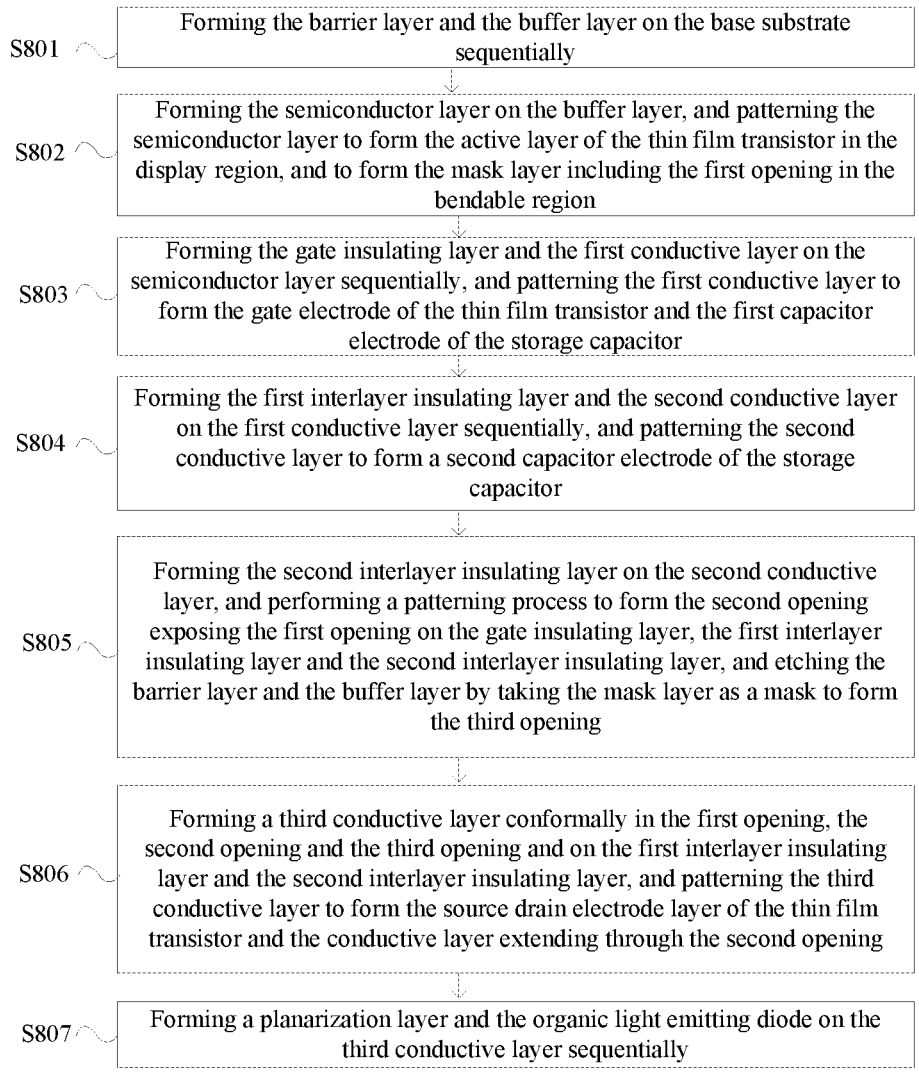
FIG. 7 is a flow chat of the manufacturing method of the array substrate according to an embodiment of the present disclosure.

FIG. 7 is a flow chart of the manufacturing method of an array substrate according to an embodiment of the disclosure. Referring to FIGS. 6A, 6B and 7, the manufacturing method includes the following steps of S801-S807.

S801: forming the barrier layer 131 and the buffer layer 132 on the base substrate 110 sequentially.

For example, the base substrate 110 is an organic flexible substrate including, for example, polyimide (PI), polyethylene terephthalate (PET), polycarbonate, polyethylene, polyacrylate, polyetherimide, polyethersulfone, and the like.

For example, the barrier layer 131 and the buffer layer 132 can include inorganic insulating materials such as an oxide of silicon, a nitride of silicon or a nitrogen oxide of silicon, such as silicon oxide, silicon nitride, silicon oxynitride, etc. or an insulating material including a metal element such as aluminum oxide, titanium nitride, etc.

For example, the barrier layer 131 and the buffer layer 132 can be formed by a chemical vapor deposition process or the like.

S802: forming the semiconductor layer 111 on the buffer layer 132, and patterning the semiconductor layer to form the active layer 121 of the thin film transistor 201 in the display area, and to form the mask layer 102 including the first opening 106 in the bendable region 140.

For example, the semiconductor layer 111 can include a simple semiconductor material or a compound semiconductor material, for example, can include amorphous silicon, polysilicon (low temperature polysilicon or high temperature polysilicon), metal oxide semiconductor (such as IGZO, AZO), and the like.

For example, the patterning process can adopt a conventional photolithography process, including photoresist coating, exposure, development, etching, photoresist stripping and other steps, which will not be described herein.

S803: forming the gate insulating layer 133 and the first conductive layer on the semiconductor layer 111 sequentially, and patterning the first conductive layer to form the gate electrode 122 of the thin film transistor 201 and the first capacitor electrode 125a of the storage capacitor 202.

For example, a step of patterning the first conductive layer can further includes forming the gate lines 142 of the array substrate.

For example, the gate insulating layer can be a single-layer structure of silicon nitride or silicon oxide, or a multi-layer structure formed by laminating silicon nitride and silicon oxide.

For example, the material of the first conductive layer includes gold (Au), silver (Ag), copper (Cu), aluminum (Al), molybdenum (Mo), magnesium (Mg), tungsten (W), and alloy materials formed by combining any of the above metal materials; or conductive metal oxide materials such as indium tin oxide (ITO), indium zinc oxide (IZO), zinc oxide (ZnO), aluminum zinc oxide (AZO), etc.

For example, the first conductive layer can be formed by processes such as sputtering, physical vapor deposition, chemical vapor deposition, and the like.

For example, the patterning process can adopt a conventional photolithography process, including photoresist coating, exposure, development, etching, photoresist stripping and other steps, which will not be described herein.

S804: forming the first interlayer insulating layer 134 and the second conductive layer on the first conductive layer sequentially, and patterning the second conductive layer to form a second capacitor electrode 126a of the storage capacitor 202.

Thus the storage capacitor 202 is formed.

For example, a step of patterning the second conductive layer can also include forming light emitting control signal (EM) lines (not illustrated) of the array substrate.

S805: forming the second interlayer insulating layer 135 on the second conductive layer, and forming the second opening 107 exposing the first opening 106 on the gate insulating layer 133, the first interlayer insulating layer 134 and the second interlayer insulating layer 135 by a patterning process, and etching the barrier layer 131 and the buffer layer 132 by using the mask layer 102 as a mask to form the third opening 108.

The patterning process in this step can refer to the specific process of forming the second opening 107 and the third opening 108 in one patterning process in S205 described above. Because the mask layer 102 having the first opening 106 has been formed before this step, the second opening 107 and the third opening 108 can be formed in one patterning process (using one mask plate) by using the mask layer as a mask, thereby simplifying the process and saving the cost.

S806: forming a third conductive layer conformally in the first opening, the second opening and the third opening, and on the first interlayer insulating layer and the second interlayer insulating layer, and patterning the third conductive layer to form the source and drain electrode layer (including the source electrode 123 and the drain electrode 124) of the thin film transistor and the conductive layer 105 extending through the second opening.

In this way, the thin film transistor 201 and other structures related thereto are formed. In this embodiment, the thin film transistor is of a top gate type structure, but the embodiment of the present disclosure is not limited to the specific type of transistor, and it can also be of a bottom gate type, a double gate type, or the like, and in a case where the transistors are of different types, the formation order of the layer structures on the base substrate is correspondingly different. For example, in one example, the conductive layer 105 and the gate electrode 122 of the thin film transistor 201 are formed by patterning the same conductive material layer.

For example, a step of patterning the third conductive layer can also include forming the data lines 141 in the display area of the array substrate and the bonding pad electrodes 180 in the bonding pad region. The conductive layer 105 can be formed into a plurality of leads that are connected to the bonding pad electrodes and the display area, thereby transmitting signals output from the chip on film 160 to the display area. For example, the bonding pad electrode 180 is connected to the data line 141 through the conductive layer 105 to provide a display data signal for the data line 141.

For example, before forming the third conductive layer, the stress buffer layer 104 can be formed to fill the first opening, the second opening and the third opening, that is, the stress buffer layer 104 is conformally formed in the first opening, the second opening and the third opening. The stress buffer layer can reduce or prevent the conductive material formed thereon from being broken due to bending stress. The stress buffer layer can be an organic insulating material, for example, the stress buffer layer includes polyimide, acrylate, epoxy resin, etc.

S807: forming a planarization layer 112 and the organic light emitting diode 190 on the third conductive layer sequentially.

For example, the planarization layer 112, the first electrode 127, a pixel defining layer (PDL) 113, the organic light emitting layer 128, and the second electrode 129 are formed on the third conductive layer sequentially.

For example, a via hole is formed in the planarization layer 112 such that the first electrode 127 is electrically connected to the drain electrode 124 of the thin film transistor 201 through the via hole.

For example, the pixel defining layer 113 is patterned to form an opening to define a light emitting region, the opening exposes at least a portion of the first electrode 127. Then, the organic light emitting layer 128 and the second electrode 129 are formed sequentially corresponding to the opening, thereby forming the organic light emitting diode 203.

For example, the manufacturing method can further include sequentially forming the first inorganic layer 191, the organic layer 192, and the second inorganic layer 193 on the organic light emitting diode to form the encapsulation layer 190.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. The protection scope of the present disclosure should be based on the protection scope of the claims.

What is claimed is:

1. A manufacturing method of a connection structure, comprising:
forming a first insulating layer on a base substrate;
forming a mask layer having a first opening on a side of the first insulating layer away from the base substrate;
forming a second insulating layer on a side of the mask layer away from the first insulating layer; and
forming a second opening exposing the first opening in the second insulating layer by one patterning process, and forming a third opening in the first insulating layer;
wherein a material of the mask layer comprises a semiconductor material, materials of the first insulating layer and the second insulating layer both comprise an inorganic insulating material, and an etching rate of the material of the mask layer is smaller than an etching rate of the materials of the first insulating layer and the second insulating layer in a same dry etching process,
forming the second opening and the third opening comprises: sequentially forming the second opening and the third opening in the same dry etching process.

2. The manufacturing method according to claim 1, wherein forming the second opening and the third opening by one patterning process comprises forming the second opening and the third opening by a same patterning mask.

3. The manufacturing method according to claim 2, wherein forming the second opening comprises: etching the second insulating layer by using an etching mask formed on the second insulating layer as a mask;
forming the third opening comprises: etching the first insulating layer by using the etching mask and a portion of the mask layer exposed by the second opening as masks, wherein the etching mask is the same patterning mask.

4. The manufacturing method according to claim 1, wherein, in a direction parallel to the base substrate, a size of the second opening is larger than a size of the first opening, and the second opening completely exposes the first opening.

5. The manufacturing method according to claim 1, wherein the material of the mask layer comprises polysilicon, the materials of the first insulating layer and the second insulating layer comprise silicon element, and a concentration of fluorine element in a gas atmosphere upon the third opening being formed is lower than a concentration of fluorine element in a gas atmosphere upon the second opening being formed.

6. The manufacturing method according to claim 1, wherein the base substrate is a flexible substrate.

7. The manufacturing method according to claim 1, further comprising:
forming a conductive layer in the first opening, the second opening, and the third opening, and on a side of the second insulating layer away from the first insulating layer.

8. A manufacturing method of an array substrate, the array substrate comprising a display area, a bonding pad region and a bendable region between the display area and the bonding pad region, the bendable region having a connection structure, the manufacturing method comprising:
forming the connection structure by the manufacturing method according to claim 1, and the first opening, the second opening and the third opening being in the bendable region.

9. The manufacturing method according to claim 8, comprising:
forming a conductive layer in the first opening, the second opening, and the third opening, and on a side of the second insulating layer away from the first insulating layer,
wherein the conductive layer further comprises a lead connecting the display area and the bonding pad region.

10. The manufacturing method according to claim 9, further comprising:
forming an active layer, a source and drain electrode layer and a gate electrode of a thin film transistor in the display area,
wherein the mask layer and the active layer are formed by patterning a same semiconductor material layer, and the conductive layer and one of the source and drain electrode layer and the gate electrode are formed by patterning a same conductive material layer.

11. The manufacturing method according to claim 9, wherein
before forming the conductive layer, the manufacturing method further comprises:
forming a stress buffer layer in the first opening, the second opening, and the third opening;
forming the conductive layer comprises: forming the conductive layer on a side of the stress buffer layer away from the base substrate;
after forming the conductive layer, the manufacturing method further comprises: forming a protective layer on a side of the conductive layer away from the stress buffer layer, a material of the protective layer comprising an organic insulating material.

12. A connection structure, comprising:
a base substrate; and
a first insulating layer, a mask layer and a second insulating layer, wherein
the first insulating layer, the mask layer and the second insulating layer are sequentially laminated on the base substrate, the mask layer comprises a first opening and a first portion not covered by the second insulating layer and surrounding the first opening, the second insulating layer comprises a second opening, the first insulating layer comprises a third opening,
the second opening exposes the first opening and the first opening exposes the third opening;
the connection structure further comprises a stress buffer layer, the stress buffer layer is in the first opening, the second opening, and the third opening and in contact with exposed surfaces of the first opening, the second opening, and the third opening.

13. The connection structure according to claim 12, wherein the mask layer further comprises a second portion covered by the second insulating layer and surrounding the first opening, and an orthographic projection of the first opening on the base substrate and an orthographic projection of the third opening on the base substrate are approximately coincident.

14. The connection structure according to claim 13, wherein a thickness of the first portion of the mask layer is smaller than a thickness of the second portion of the mask layer.

15. The connection structure according to claim 12, wherein a material of the mask layer comprises polysilicon, and materials of the first insulating layer and the second insulating layer comprise silicon element.

16. The connection structure according to claim 12, further comprising a conductive layer on a side of the stress buffer layer away from the base substrate.

17. The connection structure according to claim 16, wherein a protective layer is on a side of the conductive layer away from the stress buffer layer, and the protective layer comprises an organic insulating material.

18. An array substrate, comprising a display area, a bonding pad region, a bendable region between the display area and the bonding pad region and a connection structure,
wherein the connection structure comprises:
a base substrate; and
a first insulating layer, a mask layer and a second insulating layer, wherein
the first insulating layer, the mask layer and the second insulating layer are sequentially laminated on the base substrate, the mask layer comprises a first opening and a first portion not covered by the second insulating layer and surrounding the first opening, the second insulating layer comprises a second opening, the first insulating layer comprises a third opening,
the second opening exposes the first opening and the first opening exposes the third opening;
the connection structure is in the bendable region.

* * * * *